US009380725B2

(12) United States Patent
Broccardo

(10) Patent No.: US 9,380,725 B2
(45) Date of Patent: Jun. 28, 2016

(54) HOUSING FOR AN ELECTRICAL OR ELECTRONIC APPARATUS

(71) Applicant: EL.CO S.R.L., Schio (IT)

(72) Inventor: Livio Broccardo, Schio (IT)

(73) Assignee: EL. CO S.R.L., Schio (IT)

( * ) Notice: Subject to any disclaimer, the term of this patent is extended or adjusted under 35 U.S.C. 154(b) by 0 days.

(21) Appl. No.: 14/658,193

(22) Filed: Mar. 15, 2015

(65) Prior Publication Data

US 2015/0282371 A1    Oct. 1, 2015

(30) Foreign Application Priority Data

Mar. 25, 2014   (IT) ............... TV2014A0044

(51) Int. Cl.
*H02B 1/044* (2006.01)
*H05K 7/14* (2006.01)
*H05K 5/00* (2006.01)
*H05K 5/02* (2006.01)

(52) U.S. Cl.
CPC .................. *H05K 7/14* (2013.01); *H02B 1/044* (2013.01); *H05K 5/0017* (2013.01); *H05K 5/0217* (2013.01)

(58) Field of Classification Search
USPC ........................................... 174/480; 348/143
See application file for complete search history.

(56) References Cited

U.S. PATENT DOCUMENTS

| 4,066,838 | A | * | 1/1978 | Fujita | ..................... | H02B 1/044 |
| | | | | | | 174/503 |
| 4,273,957 | A | * | 6/1981 | Kolling, Jr. | ......... | H04M 1/0293 |
| | | | | | | 174/53 |
| 4,451,720 | A | * | 5/1984 | Ludwig | .................. | H02B 1/048 |
| | | | | | | 200/295 |
| 2008/0291643 | A1 | * | 11/2008 | Farago | .................. | H02B 1/044 |
| | | | | | | 361/747 |
| 2009/0059001 | A1 | * | 3/2009 | Wang | ..................... | H04N 7/186 |
| | | | | | | 348/143 |

* cited by examiner

*Primary Examiner* — William H Mayo, III
*Assistant Examiner* — Krystal Robinson
(74) *Attorney, Agent, or Firm* — Mark M. Friedman

(57) ABSTRACT

The invention refers to a housing of electronic apparatus mountable on a wall of an electric panel or cabinet. To ease the assembly operation on a bored wall panel, the housing comprises two parts, (i) a front portion and (ii) a hollow main body, which are separated and configured to be able to connect to one another being, when connected, on opposite sides of the panel or cabinet.

16 Claims, 1 Drawing Sheet

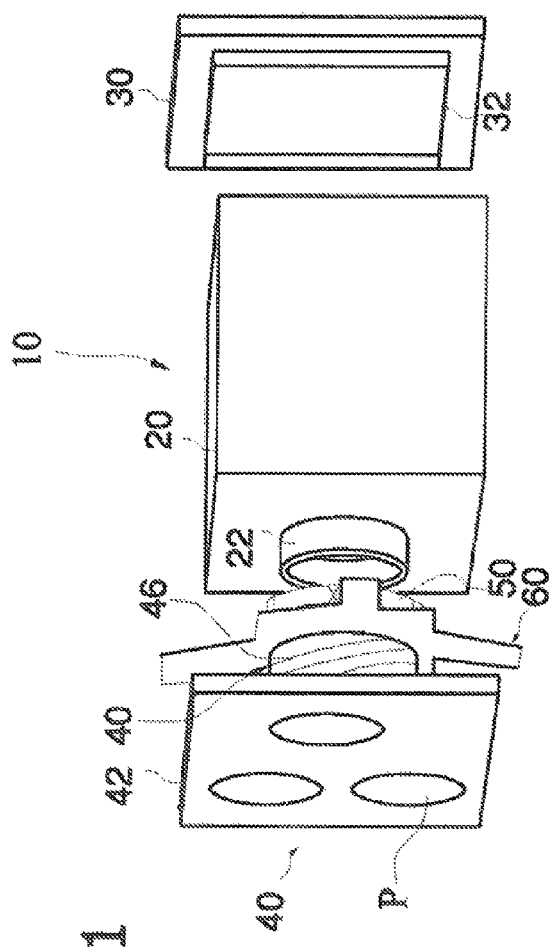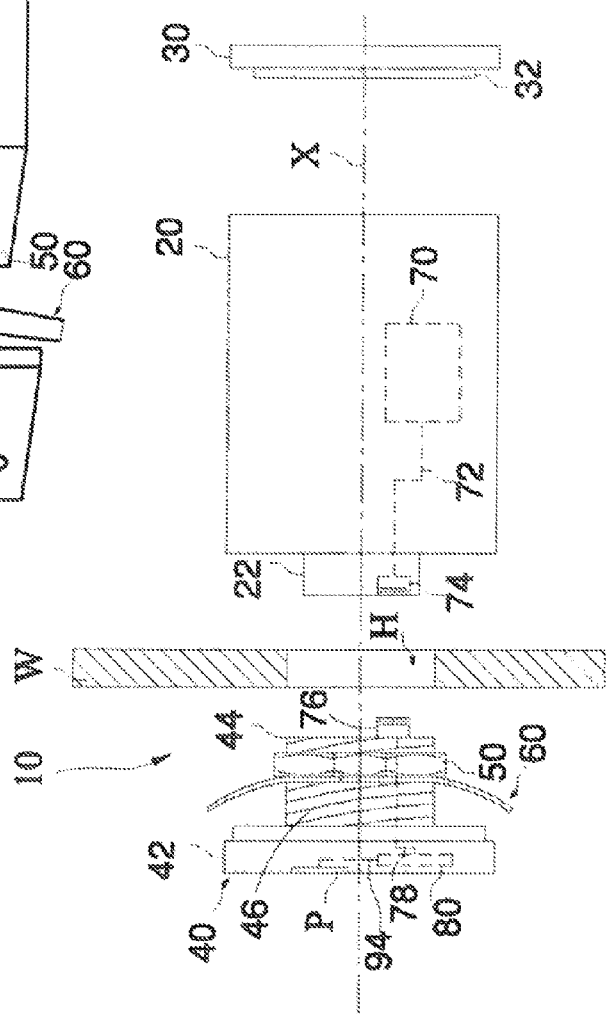

HOUSING FOR AN ELECTRICAL OR ELECTRONIC APPARATUS

FIELD OF THE INVENTION

The invention relates to a housing for an electrical or electronic apparatus mountable on a wall of an electrical panel, and to the unit equipped with the housing.

BACKGROUND OF THE INVENTION

There are known electronic equipments, e.g. temperature controllers or timers, which can be mounted on electrical panels or cabinets to compose a more complex system. To house them the panel or cabinet is perforated either with various square openings (with dimensions e.g. of 48 by 48 mm and/or 72 by 72 mm) or with smaller holes (e.g. with about 22 mm diameter).

In the circular holes fits the body of a simple panel-button, while in the square openings are mounted the above mentioned apparatuses. For this purpose they have (i) a main box-shaped body, for containing management electronics, attached to (ii) a front part. The box-shaped body has the same square section of the hole while the front part has a larger cross-section. To support the box-like body it is inserted into the square hole, while the front part lies flush with the panel from the accessible side, thus constituting the interface to the user.

Whenever an electrical panel or cabinet is set up, the wall thereof, which is typically made of steel, must be bored. Therefore, not only the operation of boring is laborious and expensive, but it is complicated by the fact of having to make square openings (awkward geometry) and in different sizes.

It is not possible to even the size of the box-shaped bodies because it depends on the number and bulk of the circuits inside the apparatus. On the other hand, it is not even possible to construct the box-shaped bodies of circular cross-section because the electronic boards are generally flat and rigid.

Obviating to at least one of these problems is the main object of the invention.

BRIEF SUMMARY OF THE INVENTION

In particular, a device is provided, which is mountable on an electrical panel or cabinet, and which is easy to install and/or simplifies the preparation operations of the panel or cabinet.

One or more objects are achieved by what is defined in the accompanying claims, wherein the dependent ones define advantageous variants.

It is proposed a housing of electronic apparatus mountable on a wall of an electric panel or cabinet,
wherein the housing comprises two parts:
(i) a front portion and
(ii) a hollow main body,
which are separated and configured to be able to connect to one another being, when connected, on opposite sides of the panel or cabinet.

The above separation of the housing in (at least) two part construction allows to disregard the size or shape of the hole made on the wall of the panel, because the two parts are capable, when they are assembled, to abut against, or tighten, opposite sides of the wall and thus they support themselves. Thus the geometric constraint is removed of having to necessarily put one part, usually the main body, into the hole, which imposes the shape of the hole or of the main body.

In particular, it is preferable and advantageous that the two parts are configured so that upon connecting to each other they can tighten the panel or cabinet on opposite sides thereof, so as to avoid any clearance between the wall and the two said parts, and thereby obtaining the stable mounting of the housing assembled on the panel.

Preferably the two parts each comprise a connecting portion and a hollow (preferably bigger) shell, wherein each portion projects cantilevered from the shell. This structure is very advantageous because it reserves space in the hollow shell for containing electronic components, and easily a connecting portion can be inserted into the opening of the panel to reach and connect with the other portion.

Preferably the said connecting portion of a part is insertable in complementary manner in said portion of the other part. This ensures an excellent mechanical connection and a way to support the weight of the two parts, especially that which usually projects a lot cantilevered from the back of the panel.

Preferably the two said portions have a circular cross-section, still more preferably with a diameter of about 21-23 mm (e.g. 22.5 mm because the current standard for the holes for buttons in electrical panels is 22 mm). Thus one can mount the housing on a panel that has been bored only with standard holes, thereby reducing both the times and the difficulty of the preparation of the panel.

Preferably on the connecting portion of a part, preferably that belonging to the front part, a fastening element is mounted adapted to block that same part against the wall of the control board or cabinet. E.g. the fastening element can be slidably mounted with respect to the portion and lockable in a desired position. In particular, the fastening element can be screwable on a thread present on the connecting portion.

Preferably between the two parts, e.g. on one of said portions, there is mounted or present an element for support on the wall of the panel or cabinet, wherein the element for support has a radial dimension greater than that of the two parts. Thus the element for support can lean against the wall and sustain the assembled housing even if the radial dimension of the opening in the wall is greater than that of the two parts.

Preferably, the element for support is mounted so that the sliding element can push it towards the wall (or towards the shell from which the relative portion extends). This creates synergy with the sliding element that empowers the grip and the adherence of the element for support on the wall.

Preferably, the support element is an elastic element, to facilitate its adaptation to any thickness of the wall.

Preferably each of said connecting portions comprises an electrical connector adapted to electrically connect with the connector of the other portion when the portions are coupled (the housing is assembled). This simplifies the electrical connection between the components present within the two parts, which can communicate by electrical signals. The housing, inside the two parts or the two shells, can house indeed standard or sui generis electronic equipment.

It is also proposed an electronic device equipped with the said housing, with all the variants described. E.g. the device can have the front part configured as an interface, e.g. with a display and/or buttons and/or indicators and/or sensors, while inside the main body there is the electronics that manages the device.

BRIEF DESCRIPTION OF THE SEVERAL VIEWS OF THE DRAWINGS

The advantages of the invention will be more apparent from the following description of a preferred embodiment of apparatus, making reference to the attached drawing in which FIG. 1 shows a three-dimensional view of the apparatus;
FIG. 2 shows a side view of the apparatus in FIG. 1.

DETAILED DESCRIPTION OF THE INVENTION

In the figures, identical numbers indicate identical or conceptually similar parts, and the device is described as in use.

An electronic device 10, e.g. a temperature controller or timer, is mountable in an opening or hole H obtained on the wall W of a known electric panel or cabinet. The hole H has an axis indicated with X.

The device 10 comprises a main box-shaped hollow body 20, for containing the control electronics, and a front part or front panel 40.

The box-shaped body 20 has square or rectangular cross-section, while the front part 40 can have greater or smaller cross-section and/or different shape.

The box-shaped body 20, which in the example is substantially a hollow parallelepiped housing, comprises at the center of a minor face a collar or cylindrical bushing 22 which surrounds an opening towards the inside. The diameter of the bushing 22 is e.g. smaller than the length of the relative side of the box-shaped body 20.

The back of the box-shaped body 20 is preferably open (for inspection or maintenance or ventilation) and closable by a wall 30 which has a step 32 complementary to the edges of said back. In known manner, the wall 30 can have openings to hold on the surface connection terminals.

The front part 40 is detached from the box-shaped body 20 and couplable to it, and comprises a hollow, preferably flat and e.g. cuboid, shell 42 from whose center extends a bushing 44 having on the outer surface a screw-thread 46. The diameter of the bushing 44 is e.g. smaller than the length of the relative side of the housing 42.

A nut 50 is present and screwable on the thread 46, so as to push a(n) (optional) spring or plate 60 (or other elastic means) towards the shell 42. The spring or plate 60 is arranged around the bushing 44 (e.g. to this aim it is perforated at its center) and between the shell 42 and the nut 50.

Preferably, the spring or plate 60 extends up to, or even beyond, the edges of the shell 42, and has a curved structure with the concavity towards the shell 42.

The front part 40 constitutes the input interface and/or the data output for the user. In particular, it can accommodate interfaces P like displays, LED, digital or analog numerical indicators, buttons, sliders, switches, selectors or potentiometers.

Preferably, the relative dimensions of the bushings 22, 44 are such that the first can fit perfectly into the second or vice versa, without any play. To keep them together after assembly various means, e.g. a hooking or bayonet joint, can be used.

The box-shaped body 20 contains one or more electronic circuits and boards 70, e.g. a microprocessor that controls the functions of the device 10. Through one or more data and/or supply lines 72 a board 70 can transfer data to or power a connector 74, couplable with another connector 76 present inside the bushing 44. The connector 76 is connected to one or more data and/or power supply lines 78 to transfer data or to supply power to one or more circuits 80 set within the shell 42, for example with the task of managing a display via a line 94 and/or of reading a keypad or interface P.

Operation and Assembly

To mount the apparatus 10 on the wall W, the wall W is perforated creating the opening to create a hole H corresponding to the diameter of the bushing 44 (e.g. 22 mm, the most common standard). Then the bushing 44 is inserted along the X axis in such hole H, and the nut 50 is screwed on the thread 46, up to tighten the front part 40 to the wall W.

The spring 60 also ensures the mounting in a square or differently-shaped hole H, or in a hole H with a size bigger than the bushing 44.

Then the bushing 22 is inserted, along the X axis, on or into the bushing 44 (it depends on the relative sizes), accomplishing the electrical connection of the connectors 74, 76, so that a board 70 can communicate and/or power supply a circuit 80. Once the connection is completed, the electrical continuity between the board 70 and the circuit 80 is reconstituted, therefore they can now work in cooperation.

It is advantageous, especially when on the lines 72, 76 a lot of data must pass or to avoid a high number of conductors, that there be at most 2 or 3 conductors and that the transmission occur by modulation or other multiplexing technique (e.g. a serial transmission).

A big advantage of the above is that the entire apparatus 10, and many similar samples, can be mounted on the wall W, which can be bored only with a circular opening (easy to do), even more advantageously with a circular opening of standard diameter, such e.g. 22 mm. Therefore one can use only one tool good for boring all the panel and for each apparatus.

Variations

The described housing is open to many variants.

E.g. the nut 50 and the thread 46 can be located on the bushing 22.

Or the bushings 22, 44 can have a thread and counter-thread for screwing on each other and simplify the assembly and/or reducing the number of components (e.g. the nut 50). In particular, the body 20 and the part 40 can joint into one another or connect to each other so as to clamp directly against the wall W, forming e.g. an adjustable-clamp structure.

The invention claimed is:

1. Housing of electronic apparatus mountable on a wall of an electric panel or cabinet, the housing comprising:
   (i) a front part including a cuboid-shaped shell; and
   (ii) a back part including a hollow, box-shaped parallelepiped shell, each of the shells adapted to contain electronic components and having connecting portions projecting cantilevered from the relative shell;
   wherein the parts are separated and correspondingly configured to be able to connect to one another being, when connected, on opposite sides of the panel or cabinet, and the front part includes a data output for a user.

2. Housing according to claim 1, wherein the two parts are configured so that upon connecting they can be tightened to the panel or cabinet on opposite sides thereof.

3. Housing according to claim 2, wherein each connection portion comprises an electrical connector adapted to electrically connect with the connector of the other connection portion when the connection portions are coupled.

4. Housing according to claim 1, wherein one of the connecting portions is insertable in complementary manner in the other of the connection portions.

5. Housing according to claim 1, wherein the connecting portions have a circular cross-section.

6. Housing according to claim 5, wherein the circular cross-section is of a diameter of about 22 mm.

7. Housing according to claim 1, wherein a fastening element is mounted on one of the connecting portions and adapted to lock the part connected thereto against the wall of the panel or cabinet.

8. Housing according to claim 7, wherein the fastening element is screwable onto a thread present on the connecting portion the fastening element is mounted on.

9. Housing according to claim 7, further comprising a support element adapted to interpose between the fastening element and the wall of the panel or cabinet, where the support element has a radial dimension greater than that of the two parts.

10. Housing according to claim 9, wherein the support element is an elastic element and is slidably mounted on the same connection portion the fastening element is mounted on, so that the fastening element is adapted to push the support element toward the shell from which that connection portion extends.

11. Electronic device equipped with the housing according to claim 1, wherein the front part is configured as an interface with a display and/or indicators and the back part houses electronic components that manages the device.

12. Electronic device according to claim 11, wherein the two parts are configured so that upon connecting the parts are adapted to be tightened to the panel or cabinet on opposite sides thereof.

13. Electronic device according to claim 12, wherein the two parts each comprise a connecting portion and a hollow shell, where each connection portion projects cantilevered from the respective shell.

14. Electronic device according to claim 13, wherein one the connecting portions is insertable in a complementary manner in the other connection portion.

15. Electronic device according to claim 14, wherein a fastening element is mounted on one of the connecting portions and adapted to lock the part connected thereto against the wall of the panel or cabinet.

16. Electronic device according to claim 15, wherein each connection portion comprises an electrical connector adapted to electrically connect with the connector of the other connection portion when the connection portions are coupled.

* * * * *